US007447727B2

(12) United States Patent
Langsdorf

(10) Patent No.: US 7,447,727 B2
(45) Date of Patent: Nov. 4, 2008

(54) RECURSIVE CARRY-SELECT TOPOLOGY IN INCREMENTER DESIGNS

(75) Inventor: Jack Langsdorf, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 857 days.

(21) Appl. No.: 10/878,765

(22) Filed: Jun. 28, 2004

(65) Prior Publication Data

US 2005/0289210 A1    Dec. 29, 2005

(51) Int. Cl.
*G06F 7/50* (2006.01)
(52) U.S. Cl. ...................................... 708/672
(58) Field of Classification Search .................. 708/672
See application file for complete search history.

(56) References Cited

U.S. PATENT DOCUMENTS

| | | | | |
|---|---|---|---|---|
| 6,347,327 B1* | 2/2002 | Petro et al. | ................... | 708/672 |
| 6,591,286 B1* | 7/2003 | Lu | .............................. | 708/672 |
| 6,665,698 B1* | 12/2003 | Tsai et al. | ................... | 708/672 |
| 2004/0015534 A1* | 1/2004 | Motoyama et al. | .......... | 708/672 |

* cited by examiner

*Primary Examiner*—David H Malzahn
(74) *Attorney, Agent, or Firm*—Carrie A. Boone, P.C.

(57) ABSTRACT

A recursive carry-select substitution operation is used to optimize the design of an incrementer and similar logic devices. A carry look-ahead incrementer features XOR gates in which the XOR gates in one or more MSBs of the incrementer can be pushed back by substituting an equivalent carry-select circuit, the carry-select circuit including a multiplexer. The push back operations occur until both inputs of the XOR gates are fed by inverters, allowing an entire stage of inverters to be eliminated in the circuit. Where a bit path includes a buffer comprising two inverters, the inverter size is selected so as to execute as a single stage. The result is a carry look-ahead incrementer in which a stage is eliminated.

3 Claims, 7 Drawing Sheets

US 7,447,727 B2

RECURSIVE CARRY-SELECT TOPOLOGY IN INCREMENTER DESIGNS

FIELD OF THE INVENTION

This invention relates to logic circuits and, more particularly, to the optimization of an incrementer design.

BACKGROUND OF THE INVENTION

Circuits that include connected logic gates, such as AND, OR, NAND, NOR, XOR and XNOR gates are known as combinational logic circuits. The output values of such circuits depend only on the values of its inputs. Decoders, multiplexers, and adders are common combinational logic circuits used in a variety of applications.

Adders, for example, are useful for many different tasks. Arithmetic/logic units (ALUs) found in most computing devices, include adders. Incrementers are specialized adders which take an n-bit input, n being an integer, and calculate the input plus one. Decrementers, similarly, calculate the input minus one.

A number of distinct arrangements of logic gates exist for producing an incrementer circuit. As with any combinational logic circuit, the design of an incrementer involves a tradeoff between speed and power consumption. An incrementer with a large number of logic gates may require more power to operate than is desirable, in some cases. A seven-stage incrementer runs more slowly than one with only five stages.

Like other combinational logic circuits, some portion of the incrementer circuit may be simplified. The throughput of processing one or more bits of the n-bit logic may be improved in this manner. Ultimately, though, the speed of the incrementer is measured according to the processing speed of the slowest bit. Other phenomena, such as carry propagation and uneven bit loading, such as when the least significant bits (LSBs) are loaded more heavily than the most significant bits (MSBs), can frustrate the efficiency of the incrementer design. Thus, not all simplifications of an incrementer design are worthwhile.

Thus, there is a continuing need to provide an incrementer/decrementer design with an improved throughput.

DETAILED DESCRIPTION

In accordance with the embodiments described herein, a recursive carry-select substitution operation is used to optimize the design of an incrementer and similar logic devices. The incrementer to be optimized, a four-stage carry look-ahead incrementer, features XOR gates in which some of the XOR gates, namely those in one or more MSBs, can be pushed back by performing one or more substitutions of a carry-select circuit. The push back operations occur until both inputs of the XOR gates are fed by inverters, allowing an entire stage of inverters to be eliminated in the circuit. Where a bit path includes a buffer comprising two inverters, the inverter size is selected so as to execute as a single stage. The result is a three-stage incrementer, known herein as a recursive carry-select incrementer.

In the following detailed description, reference is made to the accompanying drawings, which show by way of illustration specific embodiments in which the invention may be practiced. For example, an eight-bit carry look-ahead incrementer is depicted in the following examples. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1:
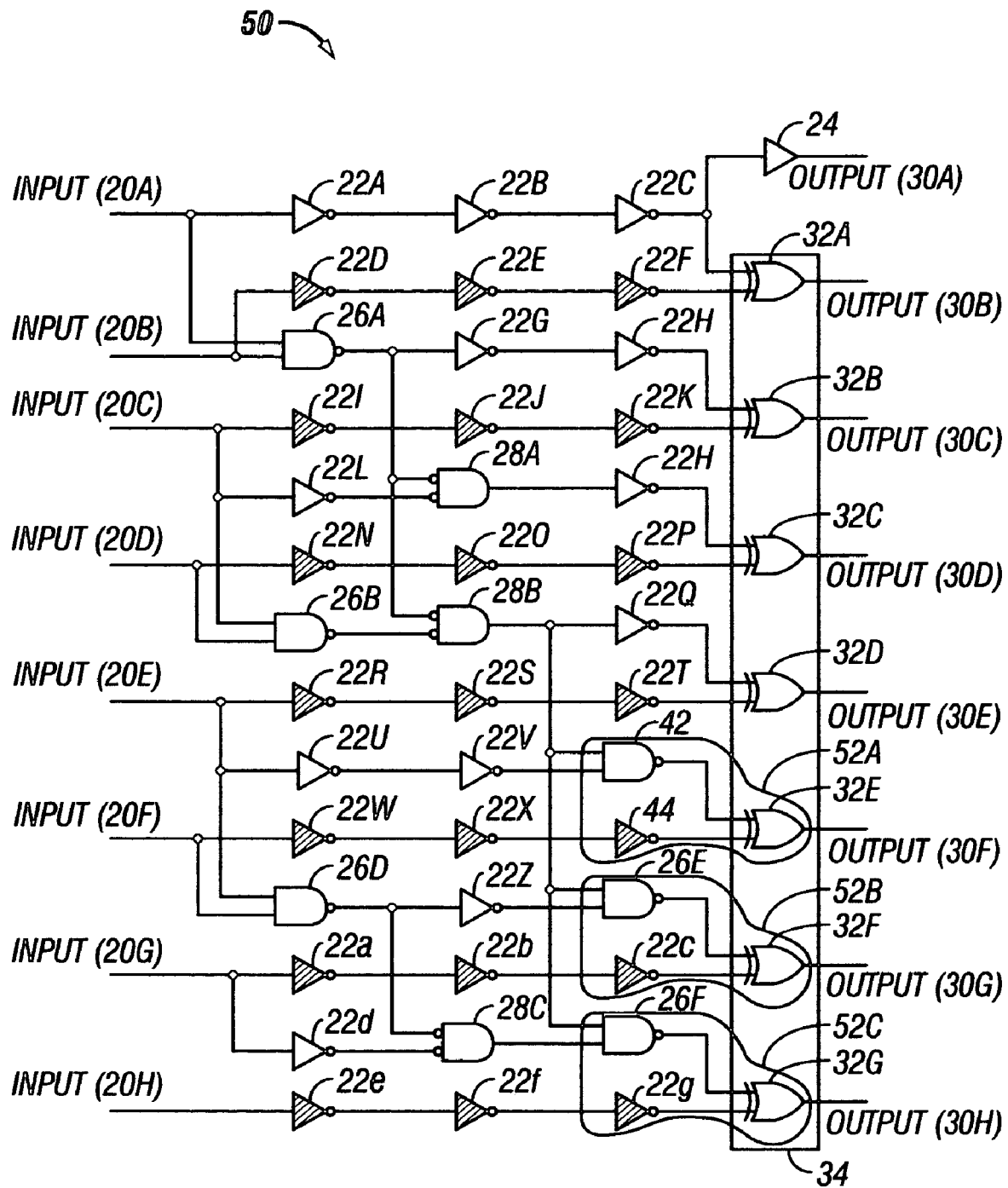
FIG. 1 is a diagram of an eight-bit carry look-ahead incrementer, according to the prior art.

In FIG. 1, a four-stage carry look-ahead incrementer 50 is depicted, according to the prior art, for producing an eight-bit output from an eight-bit input, in which the output is one greater than the input. Carry look-ahead incrementers employ XOR gates to mitigate the carry propagation effect. Carry propagation is a phenomenon in which one or more MSBs of the circuit "wait" for processing in the LSBs to complete. By including XOR gates between bit pairs at the end stage of the circuit 50, each bit can be processed fully in parallel, with the carry bit not being considered until the end of processing.

The incrementer 50 of FIG. 1 takes an eight-bit input 20A-20H (collectively, inputs 20) and produces an eight-bit output 30A-30H (collectively, outputs 30). The topology of the carry look-ahead incrementer 50 is known as a Sklansky design. The incrementer 50 includes inverters 22A-g (collectively, inverters 22), a buffer 24, NAND gates 26A-26F (collectively, NAND gates 26), NOR gates 28A-C (collectively, NOR gates 28), and XOR gates 32A-32G (collectively, XOR gates 32). The XOR gates 32, coupled to each bit pair in the last stage of processing, allow each bit to be processed in parallel, without having to wait for the carry result.

A typical carry look-ahead incrementer includes three parts: a merge tree (also known as a carry tree), a buffer section, and an output XOR section. In FIG. 1, an output XOR section 34 is shown. A buffer section 36 includes all inverters 22, which are shaded in FIG. 1. For each input 20, the inverters 22 of the buffer section 36 feed the input value to the output XOR. The remaining gates of the incrementer 50, which are neither part of the buffer section 38 nor of the output XOR section 34, constitute the merge tree 38.

The merge tree 38, or carry tree, includes NAND, NOR, buffer, and inverter gates organized in a tree-like configuration. There are many variants of the merge tree shown in FIG. 1, but they are similar in design. Using one- and two-input gates, the merge tree is at least log2n stages, where n is the number of bits and log is the base-two logarithm. (For the eight-bit incrementer 50 of FIG. 1, the merge tree is log 8, or three stages long.) For each bit of the incrementer 50, the merge tree 38 calculates whether all bits below the instant bit have a "1" value. The tree structure allows extensive logic sharing in this calculation. The output of the merge tree is known as the carry for each bit. The carry for each bit is received as an input to one of the XOR gates.

The buffer section 36 consists of a chain of inverters for each input bit 20. The buffer section 36 is not required, as the inputs 20 could be connected directly to the output XOR section 34. (For example, the input 20C could be directly connected as an input to the XOR gate 32B, bypassing the inverters 22I, 22J, and 22K of the buffer section 36.) However, the buffer section 36 reduces the load on the inputs and increases the minimum delay through the incrementer 50. Because the outputs of such circuits are typically clocked, a very fast path through the circuit can impair the clock alignment. By keeping the minimum path through the circuit at a length similar to the maximum delay path, the clocking design is simplified, which is particularly noticeable for high-frequency designs.

For each bit, the buffered version is received as an input to an XOR gate 32. The buffered input is thus XORed with the carry for each bit, to produce the increment. The result is that each bit of the output 30 is toggled if all of the bits lower than the instant bit are set to one. Decrementers and two's complement circuits can be designed in a similar fashion to that shown in FIG. 1. Adders have a similar structure as well, but include a more complex merge tree than for the incrementer 50.

Figure 2A:
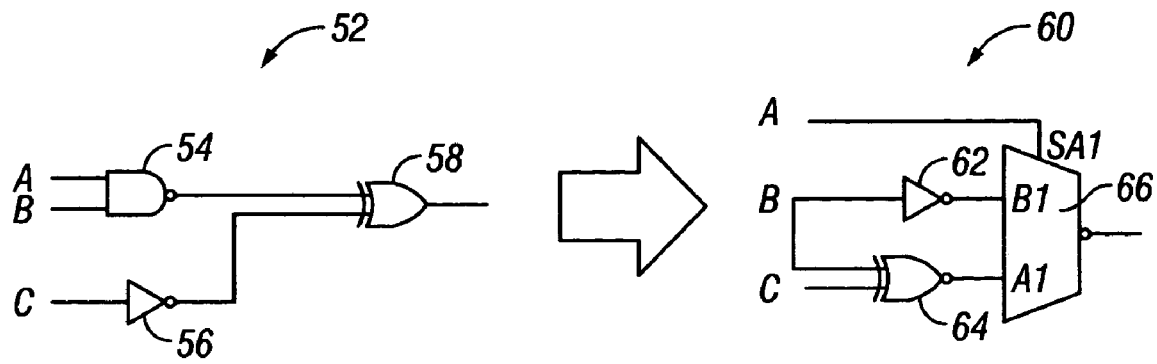
FIGS. 2A-2D are diagrams of four sets of equivalent circuits, including a carry-select circuit within each set, according to the prior art.

One simplification operation that is used to speed up some circuit designs involves a carry-select circuit. Two equivalent circuits, a circuit 52 and a circuit 60, the carry-select circuit, are depicted in FIG. 2A, according to the prior art. The circuit 52 includes a NAND gate 54, an inverter 56, and an output XOR gate 58. The circuit 52 can be logically substituted with the carry-select circuit 60. The equivalent carry-select circuit 60 includes an inverter 62, an XNOR gate 64, and a 2:1 multiplexer, or MUX 66.

Returning to FIG. 1, the circuit 52 is found in the incrementer 50 three times, labeled as circuits 52A, 52B, and 52C (collectively, circuits 52). In each circuit 52, A and B represent two parts of the merge tree 38, with A being the part from the least significant bits. C is a node in the buffer section 36.

The carry-select circuit 60 changes the loading of the inputs. Instead of having a heavily-loaded least-significant bit input (A), which passes through two stages (the NAND gate 54 and the XOR gate 58), the A input in the carry-select circuit 60 passes through one stage (the MUX 66), to determine whether the buffered version of C or the result of C XORed with B is selected. The circuit 60 is thus called a carry-select circuit because the carry input from the LSBs (A) selects which side of the MUX, the buffered version of C (which is just the input bit value) or the result of C XORed with B (the carry bit value) to enable. By substituting the circuit 52 with the carry-select circuit 60, the loading of the bit processing is shifted away from the LSB, which is typically more heavily loaded in circuits of this type.

In the carry-select circuit 52, the XOR gate 58 is duplicated (see XNOR gate 64) to produce two results: the result using the part of the carry available early, assuming first that the rest of the carry will be a 0, and then a 1. Then, when the part of the carry from the LSB arrives, it controls the MUX 66 to select the correct output.

In the MUX 66 of FIG. 2A, the A input is connected to SA1 of the MUX; the output of the inverter 62 is connected to the B1 input of the MUX while the output of the XNOR gate 64 is connected to the A1 input of the MUX. When A is 0, B1 is selected as the output of the MUX; when A is 1, A1 is selected as the MUX output.

Returning to FIG. 1, three instances of the circuit 52 of FIG. 2A are circled as circuits 52A, 52B, and 52C. The circuit 52A consists of NAND gate 26C, inverter 22Y, and XOR gate 32E; the circuit 52B consists of NAND gate 26E, inverter 22c, and XOR gate 32F; and the circuit 52C consists of NAND gate 26F, inverter 22g, and XOR gate 32G.

Each of these circuits 52A, 52B, and 52C can be replaced by the equivalent carry-select circuit 60 of FIG. 2A. For each XOR gate 32E, 32F, and 32G, the two inputs include an input from the more heavily loaded LSBs and an input from the respective MSB, which is often available early. For example, the XOR gate 32E includes an input 42 which is fed from a NAND gate coming from the bits 4-0 and an input 44, which is the buffered version of the input 20F (bit 5). The input 20F is likely to be received by the XOR gate 32E before the input 42, which includes more processing, is received. By replacing the circuit 52A with the equivalent carry-select circuit 60 of FIG. 2A, a shift in loading, toward the MSBs of the incrementer 50, occurs. Similarly, circuits 52B and 52C can be replaced with the carry-select circuit 60.

Figure 3:
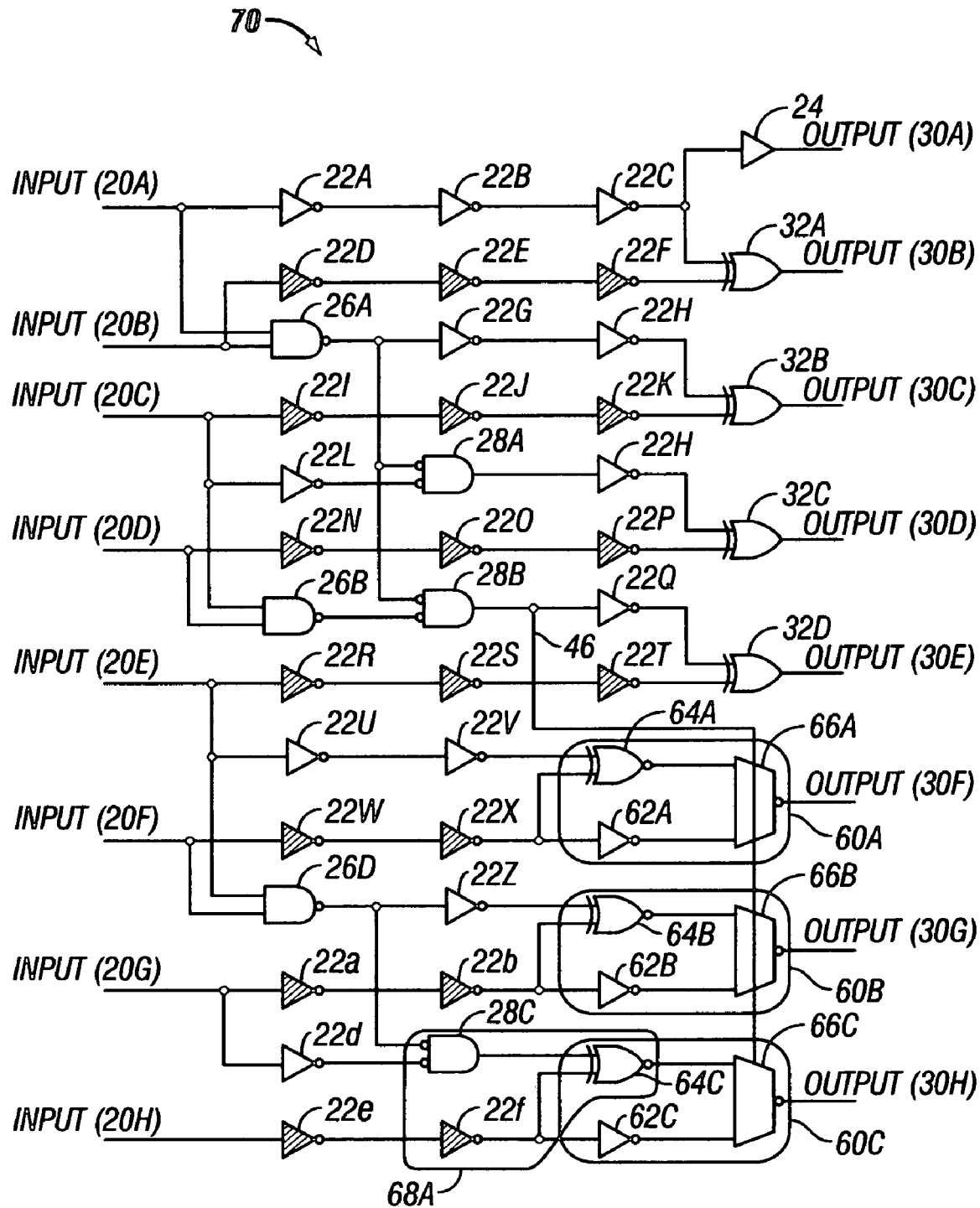
FIG. 3 is a diagram of the eight-bit carry look-ahead incrementer of FIG. 1, in which a substitution of the carry-select circuit of FIG. 2A is made, according to some embodiments.

This substitution is depicted in FIG. 3, according to some embodiments. An incrementer 70 includes three carry-select circuits 60A, 60B, and 60C which have been substituted for the circuits 52A, 52B, and 52C, respectively, of the incrementer 50 of FIG. 1. The substituted circuits 60A, 60B, and 60C perform the end-stage bit processing for inputs 20F (bit 5), 20G (bit 6) and 20H (bit 7). Circuit 60A includes XNOR gate 64A, inverter 62A and MUX 66A; circuit 60B includes XNOR gate 64B, inverter 62B and MUX 66B; and circuit 60C includes XNOR gate 64C, inverter 62C and MUX 66G.

An output 46 from NOR gate 28B is the select line for all three MUXs 66A, 66B, and 66C. The output 46 is the carry result from the processing of inputs 20A-20E (bits 4-0). The processing of inputs 20F-20G (bits 5-7) occurs in parallel with the processing of the output 46. Then, the output 46 is used to select whether to "flip" the input value (i.e., inputs 20F, 20G, or 20H), as a result of the carry, or to maintain the input value as is. By substituting the circuit 52 with the circuit 60 in the incrementer 70, the XOR gate is essentially "pushed back" in the circuit as an XNOR gate.

Figure 2B:
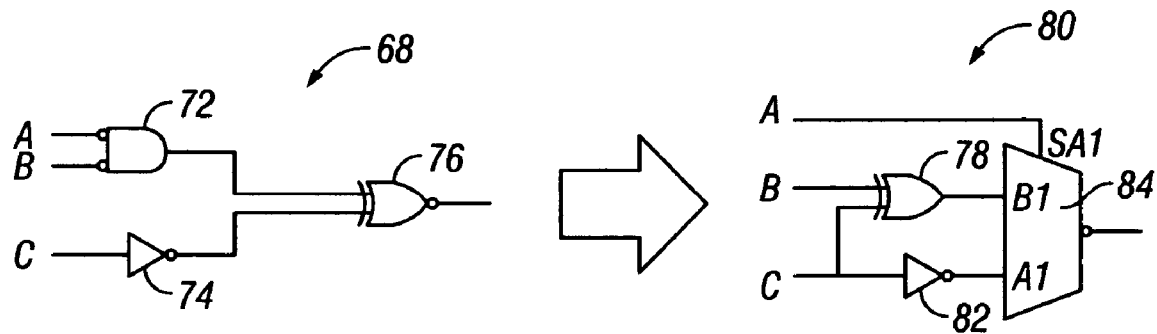

In FIG. 2B, another pair of equivalent circuits is depicted, with similarities to the equivalent circuits of FIG. 2A. The circuit 68 includes a NOR gate 72, an inverter 74, and an XNOR gate 76. The circuit 80, another carry-select circuit, includes an XOR gate 78, an inverter 82, and a 2:1 MUX 84. The A input is connected to SA1 of the MUX 84; the output of the XOR gate 78 is connected to the B1 input of the MUX while the output of the inverter 82 is connected to the A1 input. When A is 0, B1 is selected as the output of the MUX; when A is 1, A1 is selected as the MUX output.

The circuit 68 can be logically substituted with the carry-select circuit 80. As with the carry-select circuit 60 of FIG. 2A, the substitution of the carry-select circuit 80 changes the loading of the inputs. Instead of having a heavily-loaded least-significant bit input (A), which passes through two stages (the NOR gate 72 and the XNOR gate 76), the A input in the carry-select circuit 60 passes through one stage (the MUX 84), to determine whether the buffered version of C or the result of C XORed with B is selected. By substituting the circuit 68 with the carry-select circuit 80, the loading of the bit processing is shifted away from the LSB, which is typically more heavily loaded in circuits of this type.

Figure 2C:
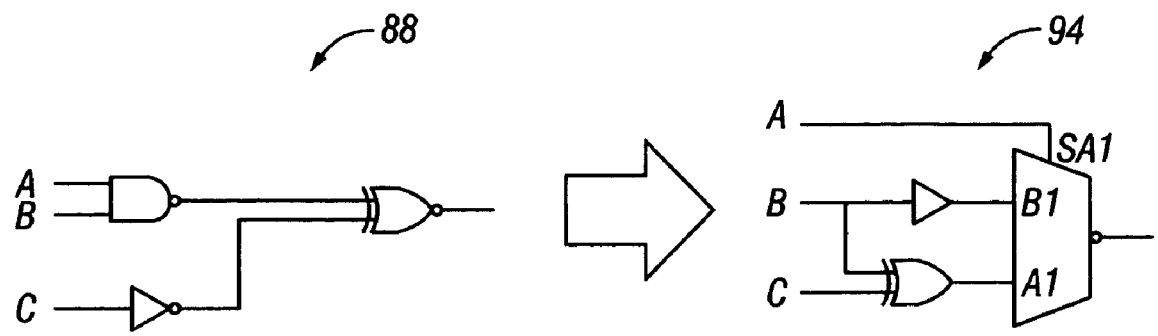
Figure 2D:
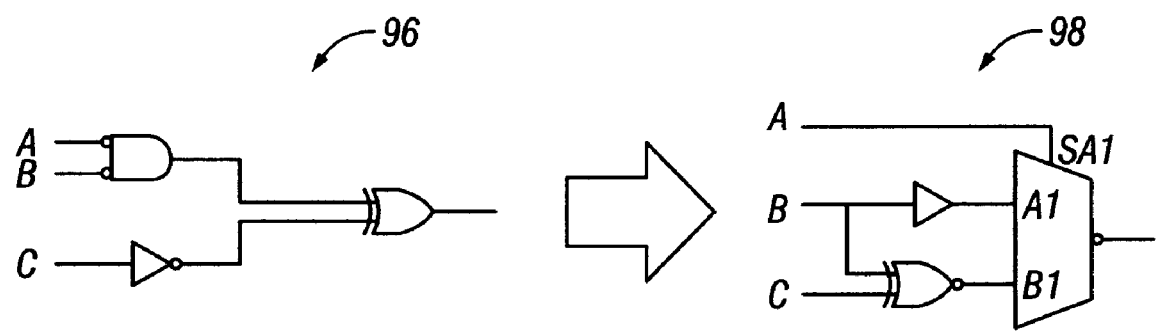

Analogous substitution of carry-select circuits can be made for other circuit arrangements than the ones depicted in FIGS. 2A and 2B. For example, as depicted in FIG. 2C, a circuit arrangement including a NAND gate feeding into an XNOR gate, such as the circuit 88, could be replaced with an equivalent circuit including an XOR gate and a MUX, i.e., the circuit 94. Likewise, a circuit including a NOR gate feeding into an XOR gate, such as is present in a four-bit carry look-ahead incrementer, could be replaced with an equivalent circuit including an XNOR gate and a MUX. Such equivalent circuits 96 and 98 are depicted in FIG. 2D. These substitutions share the feature of pushing an XOR or XNOR gate back one stage, so as to hopefully cause an inverter, rather than an AND, OR, NAND, or NOR gate, to feed into the XOR or XNOR gate.

Other circuits including AND or OR gates coupled with an XOR gate or an XNOR gate, include equivalent carry-select circuits. Although not depicted herein, substitutions of such carry-select circuits provide similar results to those depicted in the incrementer circuit 70. Circuit designers of ordinary skill in the art recognize that a number of equivalent circuits analogous to those disclosed herein may produce similar results.

Because the replacement circuit also includes an XOR or XNOR gate, the substitutions also make it possible to repeatedly perform carry-select substitutions on circuits that include XNOR and XOR gates. In this manner, the substitution operations are recursive. One substitution makes a second substitution possible, and so on. When the substituted XOR or XNOR gate is fed by inverters at both inputs, the substitutions are no longer warranted. This is because having inverters at both inputs makes it possible to reduce the incrementer by an entire stage. For very large incrementers, several stages of recursive substitutions may take place before the condition for reduction is present.

Figure 4:
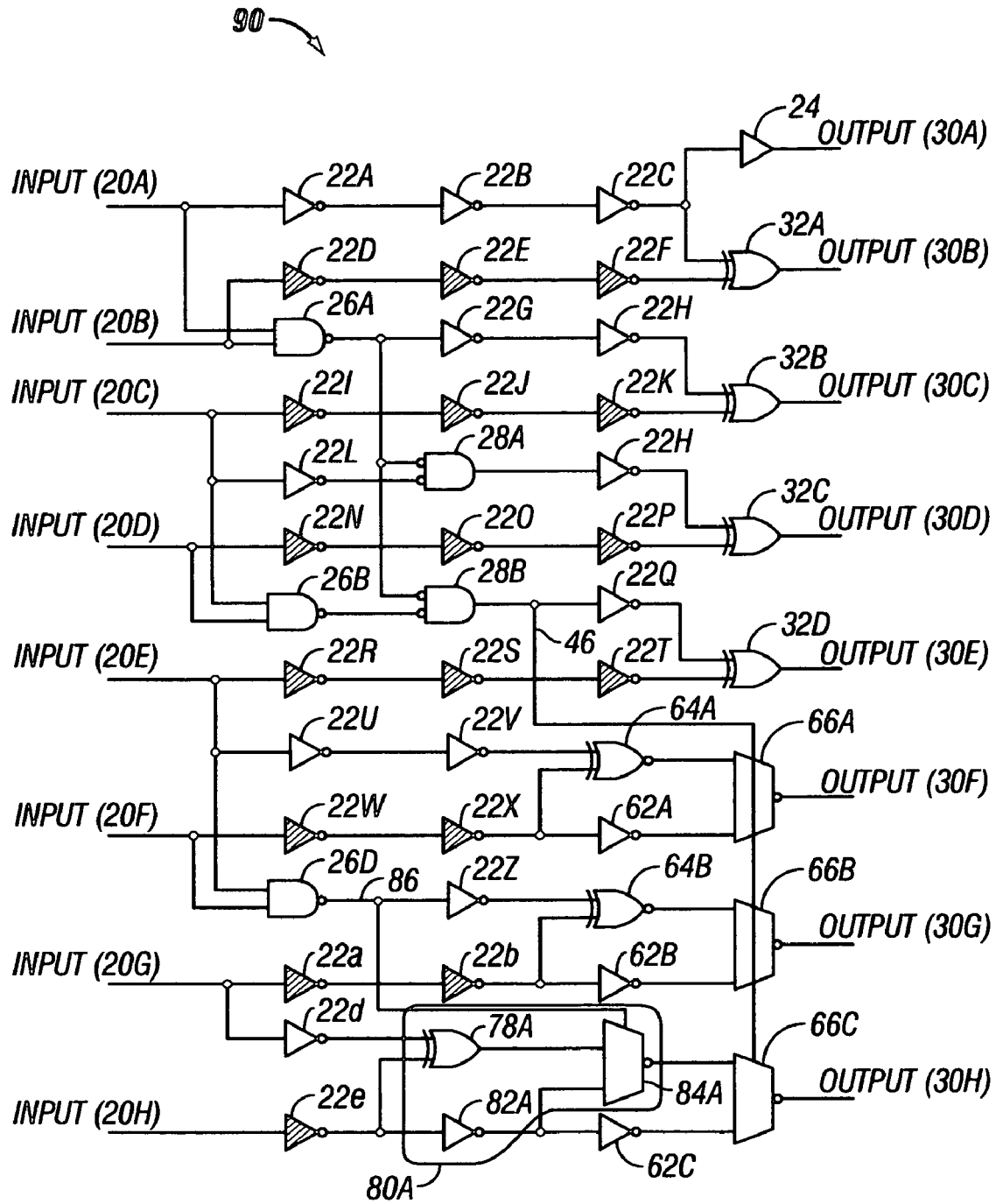
FIG. 4 is a diagram of the eight-bit carry look-ahead incrementer of FIG. 3, in which a substitution of the second carry-select circuit of FIG. 2B is made, according to some embodiments.

Returning to FIG. 3, an instance of the circuit 68 of FIG. 2B is circled as circuit 68A. The substitution of the new carry-select circuit 80 is depicted in FIG. 4, according to some embodiments. An incrementer 90 includes a carry-select circuit 80A, which has been substituted for the circuit 68A of the incrementer 70 of FIG. 3. The circuit 80A includes XOR gate 78A, inverter 82A, and MUX 84A.

An output 86 from NAND gate 26D is the select line for the MUX 84A. By substituting the circuit 68 with the circuit 80 in the incrementer 90, the XNOR gate is essentially "pushed back" in the circuit as an XOR gate.

The substitutions performed thus far have shifted the processing burden from the heavily loaded LSBs to the MSBs. Since the carry-select is performed by the MUXs at the end of processing, the delay associated with carry propagation is also diminished. However, each bit processed in the inverter 90 passes through four stages. Thus, the speed of the enhanced incrementer 90 (FIG. 4) is about the same as the original incrementer 50 (FIG. 1).

The substitution operations described above have the effect of moving the XOR gate back one stage, a "push back" operation, placing XNOR gates in the third stage. A second "push back" operation occurred in bit seven, such that an XOR gate is now positioned at the second stage of the incrementer. The push back operations cause the inputs of the XOR/XNOR gates to be fed, not by NAND gates (see NAND gates 26C-E of FIG. 1), but by inverters. Once both inputs of the XOR/XNOR gates are fed by inverters, additional simplification of the inverter can be made.

Where a two-input XOR gate includes inverters at each input, both inverters can be removed without changing the output of the XOR gate. Thus, inverters 22C and 22F, which feed into the two inputs of the XOR gate 32A, can be removed. Likewise, inverters 22H and 22K, which feed into the XOR gate 32B, can be removed; inverters 22M and 22P, which feed into the XOR gate 32C, can be removed; inverters 22Q and 22T, which feed into the XOR gate 32D, can be removed; inverters 22d and 22e, which feed into the XOR gate 78A, can be removed.

The reduction rule also applies where an XNOR gate is present. Thus, inverters 22V and 22X, which feed into the XNOR gate 64A, can be removed; inverters 22Z and 22b, which feed into the XNOR gate 64B, can be removed.

The removal of inverter pairs could have taken place in the LSBs of the inverter 50 of FIG. 1, since both inputs of the XOR gates 32A-32E were inverters. However, such reduction would not have increased the throughput of the incrementer 50, since the simplification of the MSBS, namely bits five through seven, could not be made. The substitutions according to FIGS. 2A-2D, however, make the whole-stage reduction of the incrementer 90 possible.

In three of the instances where reduction is possible, an inverter drives both the XOR (or XNOR) gate and another inverter that is parallel to the XOR (XNOR) gate. Inverter 22X drives both XNOR gate 64A and inverter 62A; inverter 22b drives XNOR gate 64B and inverter 62B; inverter 22e drives XOR gate 78A and inverter 82A. Rather than removing these three inverters (22X, 22b, and 22e) from the incrementer 90, these inverters are removed from the input path of their respective XOR (XNOR) gates, and combined with the inverters (inverters 62A, 62B, and 82A, respectively) to form buffers.

Figure 5:
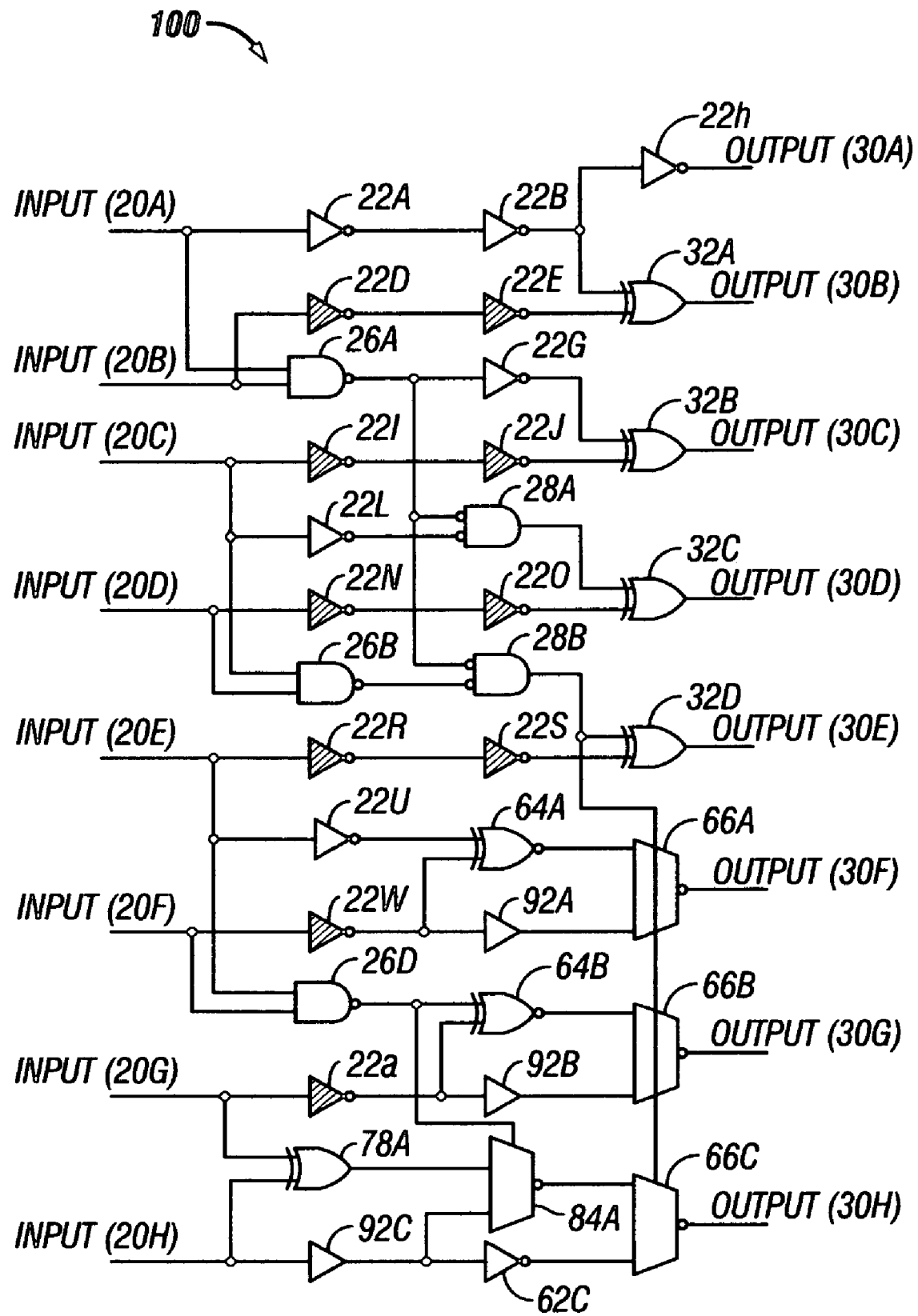
FIG. 5 is a diagram of the eight-bit carry look-ahead incrementer of FIG. 4, in which a stage of inverters is removed, according to some embodiments.

In FIG. 5, an optimized incrementer 100, or recursive carry-select incrementer, is depicted, including the above-described equivalent gate substitutions and reductions. The incrementer 100 includes three buffers 92A, 92B, and 92C (collectively, buffers 92). Buffer 92A is a combination of inverters 22X and 62A; buffer 92B is a combination of inverters 22b and 62B; buffer 92C is a combination of inverters 22e and 62C.

Each input 20 of the recursive carry-select incrementer 100 is processed through three stages rather than four. Because the buffers 92 comprise two inverters, the path of each buffer 92 is technically still two stages. However, each inverter can be selected so as to ensure that the two stages execute as quickly as one stage on another path. For example, a first inverter of the buffer 92 can be made as big as the second inverter. Since inverters normally drive gates three or four times their size, the first inverter coupled with the second inverter of the same size will perform about as quickly as a single inverter. Thus, the incrementer 100 executes as a three-stage device, a substantial improvement over the speed of the prior art incrementer 50 of FIG. 1.

The total gate usage of the recursive carry-select incrementer 100 is lower than for the prior art incrementer 50 as well. While the prior art incrementer 50 includes 50 gates (one buffer, 33 inverters, 6 NAND gates, 3 NOR gates, and 7 XOR gates), the recursive carry-select incrementer 100 includes 48 gates, where each 2:1 MUX includes four gates (4 buffers, 16 inverters, 3 NAND gates, 2 NOR gates, 7 XOR gates, and 4 MUXs×4). Thus, the recursive carry-select incrementer 100 is an improvement both in speed of operation and in gate usage.

The improvement in throughput realized by the recursive carry-select incrementer 100 can be used achieve higher clock frequency in a computer system or other device. By reducing the number of transistors (the building blocks by which every gate described herein is constructed), the circuit improvement can instead be used to reduce area or power cost at the same frequency. Incrementers are, and will continue to be, a very common feature in custom very large-scale integration (VLSI) chips. Many designs can be improved using the recursive carry-select incrementer 100.

The improvements described above can be made on other combinational logic circuits, such as decrementers, combined incrementer/decrementer devices, two's complement circuits, and other topologies. Circuits that may be simplified using the above scheme include those with a regular prefix-graph structure, in which inputs enter an interconnected tree of NAND and NOR gates, as well as a second set of buffer paths. Each output of the circuit comes from either an XOR between the carry tree and the buffer or from a 2:1 MUX. The data inputs to the 2:1 MUXs are either themselves 2:1 MUXs or pairs of signals where one is a buffered input and the other is that buffered input XORed with nearby bits from the carry tree.

The recursive carry-select topology exploits several features of the prior art topology of FIG. 1. The incrementer 50 of FIG. 1 is known as a Sklansky topology. However, other topologies can be optimized using the recursive carry-select topology. By performing the initial substitution of FIG. 2A on the MSBs, the XOR gate in the new circuit can often be pushed back again, using the substitution of FIG. 2B. The XOR is pushed back until the input from the carry tree side is an inverter. In most carry tree topologies, almost all size merge trees are designed so there is an inverting stage at least once in every bit slice. If the XOR for every bit in the tree can be pushed back far enough to have an inverter input from the carry tree, then one whole stage of the circuit can be removed by removing all the inverters that feed into the XOR gates.

Figure 6:
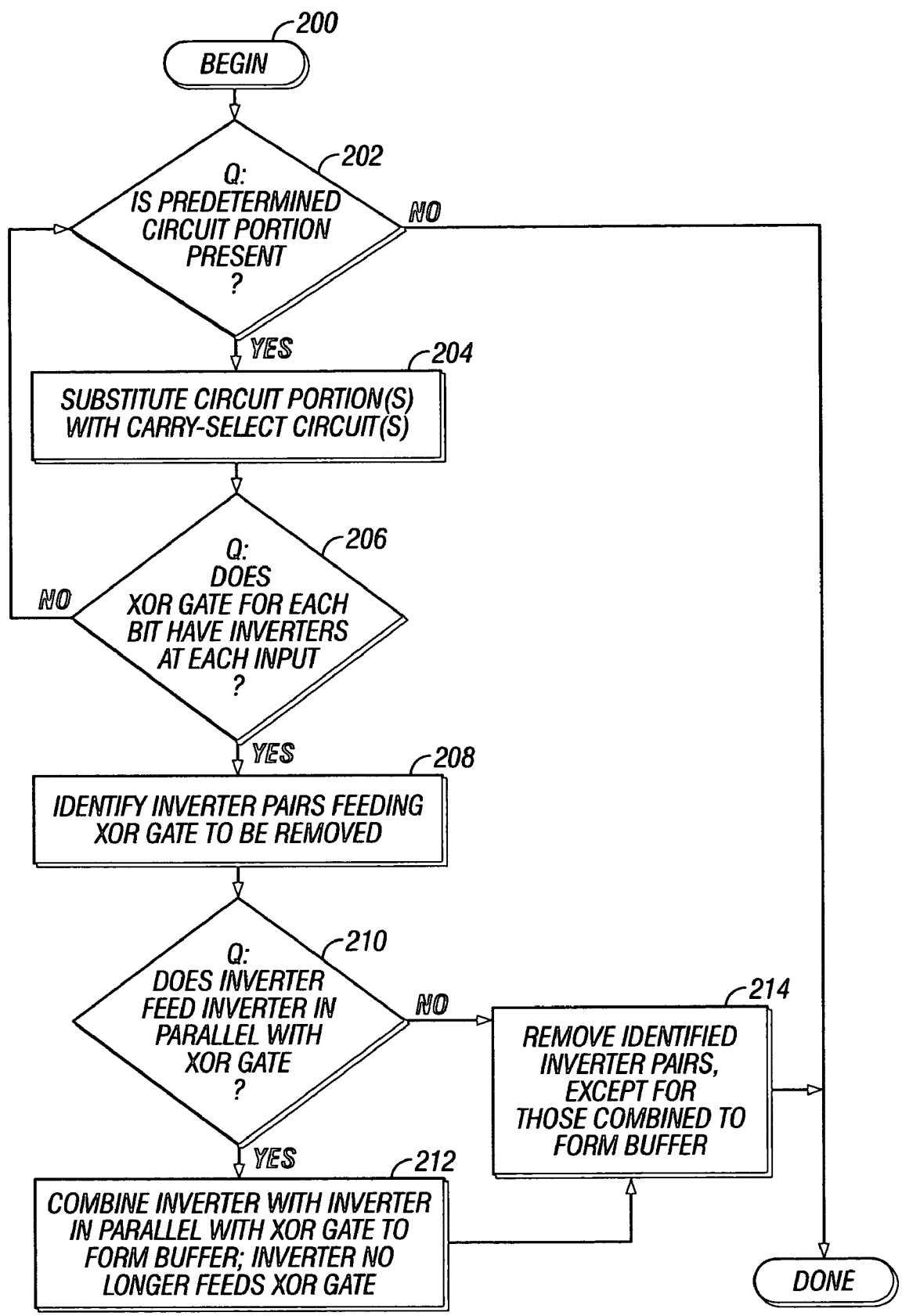
FIG. 6 is a flow diagram depicting a method for implementing the recursive carry-select incrementer design of FIG. 5, according to some embodiments.

FIG. 6 is a flow diagram showing the method for producing the recursive carry-select incrementer 100 of FIG. 5, according to some embodiments. With the equivalent circuits of FIGS. 2A-2D in mind, the method begins by ascertaining whether the circuit 52 (or the circuit 68) is present in the circuit design (diamond 202). If so (the "Y" prong of diamond 202), a substitution operation using the carry-select circuit 60 (or the carry-select circuit 80) is performed (block 204). If not (the "N" prong of diamond 202), no further processing can take place.

Once it has been determined that the XOR gate for each input (bit) of the incrementer has inverters at each input, a reduction operation to reduce the number of stages is possible. In a four-bit incrementer, for example, the reduction operation (eliminating pairs of inverters) is possible after a single substitution operation takes place. A single carry-select substitution of a three-stage four-bit incrementer reduces the incrementer to a two-stage circuit. The carry-select substitution is not recursive, however, as a single substitution is sufficient to reduce the number of stages. The recursive carry-select procedure, outlined above, is performed for incrementers and similar circuits of eight bits or more.

Thus, in the flow diagram of FIG. 6, the circuit design is inspected to ascertain whether each bit includes two inverters feeding into an XOR gate (diamond 206). If not (the "N" prong of diamond 206), control proceeds back to the beginning of the flow diagram (block 202), so that additional substitution operations can take place (in order to further push back XOR/XNOR gates) in the circuit until both inputs are fed by inverters). In the eight-bit incrementer design described above, two rounds of substitution occurred, the first time in which three instances of the circuit 52 were replaced with the circuit 60, the second time in which one instance of the circuit 68 was replaced by the circuit 80. In a sixteen-bit incrementer design, three substitution rounds would occur, and so on, for larger and larger n of n-bit circuits.

If, instead, the circuit includes an XOR gate at each input in which each input is fed by an inverter (the "Y" prong of diamond 206), the inverter pairs feeding into the respective XOR gates at each bit are identified (block 208). These inverter pairs are to be removed, with one exception. Where the identified inverters feed a second inverter that is in parallel with the XOR gate (the "Y" prong of diamond 210), those inverters are not removed, except from the path of the XOR gate, and are combined together to form a buffer (block 212). The remaining identified inverters are removed (block 214). Since inverters from each state are removed (or combined into buffers), the essence of the method described in FIG. 6 is to reduce the number of stages in the circuit.

The method 200 of FIG. 6 will not work in all cases. Where the query in diamond 206 cannot be affirmatively answered, it will not be possible to eliminate an entire stage of the circuit. For the Sklansky (carry look-ahead) topology, incrementers of size $2^n+1$ (n being an integer number of bits) would not succeed in using the recursive carry-select method described above. The substitutions of FIGS. 2A-2D may work, but the reduction operation, in which a stage of incrementers is removed, would not succeed. Nine- and seventeen-bit carry look-ahead incrementers, for example, fit into this category.

While the invention has been described with respect to a limited number of embodiments, those skilled in the art will appreciate numerous modifications and variations therefrom. It is intended that the appended claims cover all such modifications and variations as fall within the true spirit and scope of the invention.

I claim:

1. A method for simplifying a combinational logic circuit comprising one or more sub-circuits, the method comprising:
    replacing the one or more sub-circuits within the combinational logic circuit with one or more carry-select circuits, the one or more sub-circuits being selected from a group consisting of:
        a NAND gate and an inverter, both of which are fed into an XOR gate;
        a NOR gate and an inverter, both of which are fed into an XNOR gate;
        a NAND gate and an inverter, both of which are fed into an XNOR gate; and
        a NOR gate and an inverter, both of which are fed into an XOR gate;
    each carry-select circuit comprising a multiplexer being fed by an inverter and a first gate, the first gate comprising either an XOR gate or an XNOR gate;
    continuing to replace sub-circuits with carry-select circuits until no more sub-circuits are present in the combinational logic circuit; and
    removing pairs of inverters from the combinational logic circuit, the pairs of inverters comprising a first inverter and a second inverter, the first inverter being fed into a first input of a particular gate, the particular gate being either an XOR gate or an XNOR gate, the second inverter being fed into a second input of the particular gate, wherein, rather than being explicitly removed, the first inverter is combined with an outside inverter to form a buffer if the first inverter also feeds into the outside inverter, and the second inverter is simply removed;
    wherein the number of stages of the combinational logic circuit is reduced by one when the pairs of inverters are removed.

2. The method of claim 1, wherein the number of inverter pairs removed is equal to the number of inputs in the combinational logic circuit minus one.

3. A method for simplifying a combinational logic circuit, comprising:
    replacing one or more sub-circuits in the combinational logic circuit with a carry-select circuit, each of the sub-circuits being selected from a group consisting of:
        a NAND gate and an inverter, both of which are fed into an XOR gate;

a NOR gate and an inverter, both of which are fed into an XNOR gate;

a NAND gate and an inverter, both of which are fed into an XNOR gate; and a NOR gate and an inverter, both of which are fed into an XOR gate;

wherein the sub-circuit is equivalent to the carry-select circuit, the carry-select circuit comprising a replacement gate, wherein the replacement gate is either an XNOR gate or an XOR gate;

replacing one or more additional sub-circuits with carry-select circuits until all inputs of the one or more replacement gates are fed by inverters, wherein the one or more additional sub-circuits are generated during the previous replacement; and removing pairs of inverters from the combinational logic circuit, the pairs of inverters comprising a first inverter and a second inverter, the first inverter being fed into a first input of a particular gate, the particular gate being either an XOR gate or an XNOR gate, the second inverter being fed into a second input of the particular gate, wherein, rather than being explicitly removed, the first inverter is combined with an outside inverter to form a buffer if the first inverter also feeds into the outside inverter, and the second inverter is simply removed.

\* \* \* \* \*